United States Patent [19]

Korff

[11] Patent Number: 4,573,127

[45] Date of Patent: Feb. 25, 1986

[54] PROGRAMMABLE ELECTRONIC REAL-TIME LOAD CONTROLLER, AND APPARATUS THEREFOR, PROVIDING FOR UPDATING OF PRESET CALENDAR EVENTS

[75] Inventor: William W. Korff, Seattle, Wash.

[73] Assignee: Butler Manufacturing Company, Kansas City, Mo.

[21] Appl. No.: 452,627

[22] Filed: Dec. 23, 1982

[51] Int. Cl.[4] ...................... G01R 21/00; G06F 15/20; G06F 15/56

[52] U.S. Cl. ...................................... 364/493; 307/40; 364/138; 368/28

[58] Field of Search ............... 364/483, 492, 464, 705, 364/138; 368/28, 29, 34, 41; 324/116; 40/120, 107, 109; 307/35, 39, 40

[56] References Cited

U.S. PATENT DOCUMENTS 4,274,146 6/1981 Yanagawa .......................... 364/705
4,283,772 8/1981 Johnston ............................ 364/483
4,291,375 9/1981 Wolf .................................. 364/483
4,293,915 10/1981 Carpenter et al. .................. 364/493
4,347,576 8/1982 Kensinger et al. .................. 364/493
4,355,361 10/1982 Riggs et al. ........................ 364/483
4,357,665 11/1982 Korff .................................. 364/493
4,415,271 11/1983 Mori .................................... 368/41

*Primary Examiner*—Felix D. Gruber
*Attorney, Agent, or Firm*—Christensen, O'Connor, Johnson & Kindness

[57] ABSTRACT

Certain calendar events, such as the standard/daylight time transition or a holiday such as Labor Day, always occur on the same alphabetic day always having the same relationship to the beginning or end of the same month in any year; however, their numeric day varies from year to year. In order to update the numeric day of such a calendar event that is used by a microprocessor of a programmable electronic real-time load controller, the microprocessor selects a reference day value representing the numeric day of the calendar event in a given year and selects a reference year value representing the numeric year of that year. At the beginning of each real-time year, the microprocessor determines a real-time year value representing the numeric year of the real-time year, determines a current numeric day value for the calendar event from the reference day value, the reference year value, and the real-time year value, and stores the current numeric day value for use during the current real-time year.

17 Claims, 10 Drawing Figures

PROGRAMMABLE ELECTRONIC REAL-TIME LOAD CONTROLLER, AND APPARATUS THEREFOR, PROVIDING FOR UPDATING OF PRESET CALENDAR EVENTS

BACKGROUND OF THE INVENTION

This invention generally relates to programmable electronic real-time load controllers and apparatus therefor, and more particularly to such a controller and apparatus providing for the determination and storage of the actual day of a preset calendar event.

FIELD OF THE INVENTION

Programmable electronic real-time load controllers are known to the art for controlling the energization of a plurality of electrical loads in accordance with a predetermined time schedule. An example of such a controller can be found in U.S. Pat. No. 4,293,915, Carpenter et al., which is assigned to the assignee of the present invention. The controller in Carpenter et al. includes: a plurality of load control circuits, each load control circuit being adapted to be interconnected with an electrical load circuit or "load", and having a load-on state when its load is to be on, and a load-off state when its load is to be off; a clock for accumulating real-time information; and, a data processor, operating under control of a stored program, for responding to real-time information obtained from the clock to effect control of the load-on and the load-off states of each of the plurality of load control circuits in accordance with a time schedule and other control information that has been stored in the data processor. The user of this controller may preprogram the time schedule by selecting a number of control events and associated event times for each of the plurality of loads. The control events and event times for each load can be assigned to each day of the week and stored in a corresponding day schedule, and can be assigned to a holiday and stored in a corresponding holiday schedule. Normally, the control events and event times in each day schedule are utilized upon occurrence of the corresponding day in real-time; however, the control events and event times in the holiday schedule are utilized upon the occurrence of a preset holiday data in real-time. Each selected control event either causes the load to be turned on, to be turned off, or to be duty-cycled, from a time in real-time corresponding to the associated event time to a time in real-time corresponding to the event time of a subsequent control event for the load.

The clock specifically disclosed in Carpenter et al. is a weekly or seven-day clock. As a result, the preset holiday data for each load must be selected each week by the user. In addition, the transition from standard to daylight time, and the transition from daylight to standard time, both of which require modification to the real-time information in the clock, must be entered into the data processor by the user at the occurrence of those calendar events. An improved controller of the type specifically disclosed in Carpenter et al. includes a yearly or 365-day clock. This improved controller accordingly permits the user to preset a number of calendar events, such as the standard/daylight transition, the daylight/standard transition, and a number of holiday dates, by entering into the data processor the month and day of each calendar event. In the improved controller, the data processor adjusts the real-time information in the clock upon the occurrence in real-time of the month and day of the standard/daylight and daylight/standard transitions, and selects the holiday schedule for a load upon the occurrence in real-time of the month and day of each holiday date.

A disadvantage of this improved controller is that the majority of calendar events, being entered as they are by month and day, are valid only for a single year. Although the day of certain holidays such as Christmas remains the same from year to year, the days of certain other holidays such as Labor Day and the days of the standard/daylight and daylight/standard transitions vary from year to year. For example, Labor Day is always the first Monday in September, the standard/-daylight transition is typically the last Sunday in April, and the daylight/standard transition is typically the last Sunday in October. Accordingly, certain of the calendar events must be reentered eacy year in order for those calendar events to valid during the coming year. The present invention is therefore directed in its preferred form to a controller of the type described, and an apparatus therefor, that provide for the periodic, e.g., yearly, determination and storage of the actual day of a preset calendar event.

SUMMARY OF THE INVENTION

The invention consists of an apparatus for determining and storing the current numeric day of a preset calendar event of the type that always occurs on the same alphabetic day always having the same relationship to the beginning or end of the same month in any year but whose numeric day varies from year to year. The apparatus comprises: means storing a reference day value representing the numeric day of the calendar event in a given year; means storing a reference year value representing the numeric year of that given year; means determining a real-time year value representing the numeric year of the real-time year; means determining a current numeric day value for the calendar event from the reference day value, the reference year value, and the real-time year value; and, means storing the current numeric day value.

Preferably, the means determining the current numeric day value includes: means determining a temporary numeric day value for the calendar event by decrementing the reference day value in relation to the number of leap years and nonleap years that have elapsed between the year represented by the reference year value and the year represented by the real-time year value; means determining a numerical limit for the current numeric day value in view of the relationship of the corresponding alphabetic day to the beginning or end of the month in which the alphabetic day occurs; means comparing the temporary numeric day value with the numerical limit and adjusting the temporary numeric day value so that the temporary numeric day value falls within the numerical limit; and, means selecting the temporary numeric day value as the current numeric day value.

In its preferred form, this apparatus is implemented as an improvement to an electronic controller that includes at least one load control circuit for controlling the energization state of a corresponding electrical load, and, a data processor operating under control of a stored program. The data processor accumulates real-time information representing the numeric day, month and year of real-time, stores a predetermined schedule for control of the load, compares its predetermined schedule for load control with its real-time information, and causes the load control circuit to control the energization state of the load in accordance with that comparison. The data processor also stores at least one calendar event of the type described by its numeric day and its numeric month, compares the stored numeric day and numeric month of the calendar event with its real-time information, and undertakes a predetermined control action relating either to its real-time information or to its schedule for load control upon the occurrence in real-time of the stored numeric day and numeric month of the calendar event.

In the improvement, such a data processor is operative to:

select, as a reference day, the numeric day of the calendar event in a given year;

select, as a reference year, the numeric year of that year; and, update the stored numeric day of the calendar event by periodically:

(a) determining the real-time numeric year from its real-time information;

(b) determining a temporary numeric day for the calendar event by decrementing the reference day in relation to the number of leap years and nonleap years that have elapsed between the reference year and the real-time year;

(c) determining a numerical limit for the numerical day of the calendar event in view of the relationship of the corresponding alphabetic day to the beginning or end of the month in which the alphabetic day occurs;

(d) comparing the temporary numeric day with the numerical limit and adjusting the temporary numeric day so that the temporary numeric day falls within the numerical limit; and, (e) storing the temporary numeric day as the numeric day of the calendar event for the real-time year.

Preferably, the stored numeric day of the calendar event is updated at yearly intervals, such as at the beginning of each real-time year.

BRIEF DESCRIPTION OF THE DRAWINGS

The invention can best be understood by reference to the following portion of the specification, taken in conjunction with the accompanying drawings in which.

DESCRIPTION OF A PREFERRED EMBODIMENT

Figure 1:
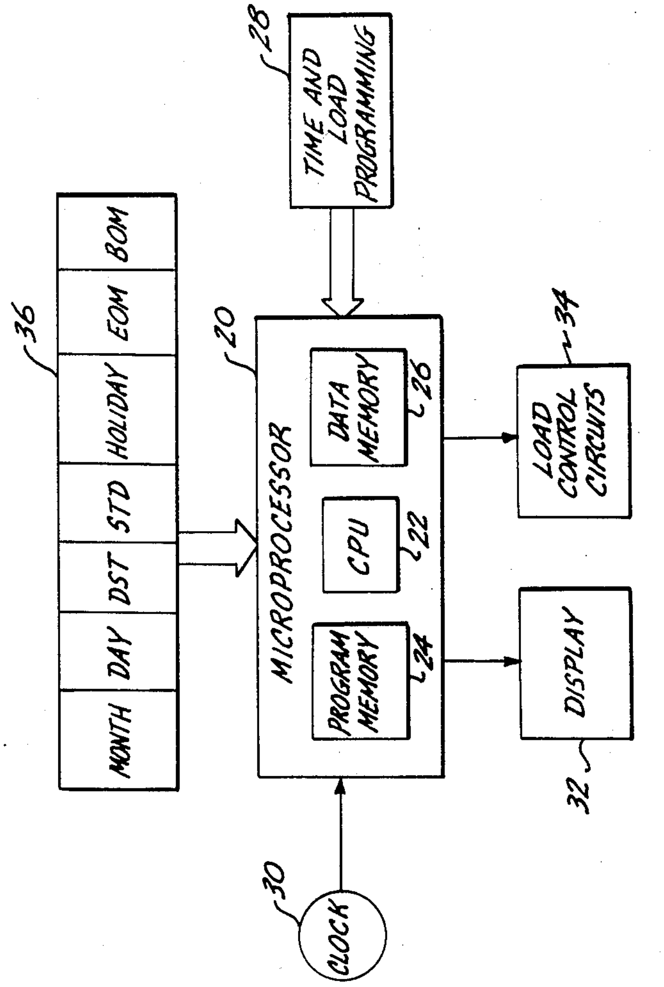
FIG. 1 is a block diagram illustrating a programmable electronic real-time load controller including a microprocessor having a program memory and a data memory.

Referring now to FIG. 1, the programmable electronic real-time load controller includes a microprocessor 20 that contains: a CPU 22; a program memory 24; and, a data memory 26. Microprocessor 20 receives input and control data from time and load programming controls 28 and also receives time-base information from a hardware clock 30, and outputs display data to a display 32 and control signals to a plurality of load control circuits 34, one for each load.

Data memory 26 contains: a real-time clock whose contents are periodically updated by the time-base information from clock 30; a predetermined time schedule for load control; and, certain other control data relating to that time schedule. Through time and load programming controls 28, a user may enter or alter the information in the real-time clock, may enter or alter the time schedule for load control, and may cause certain data to be displayed by display 32. In the time schedule, each load has assigned thereto a holiday schedule and a plurality of day schedules, one for each day of the week. Each day schedule and each holiday schedule may include one or more control events and associated event times, with each control event representing a predetermined control function for the associated load that is to begin at the associated event time in real-time.

By comparing the information in the real-time clock with the event times in the time schedule, microprocessor 20 determines the occurrence in real-time of each control event for a load and implements the control function represented by that control event by transmitting appropriate control signals to the corresponding one of the plurality of load control circuits 34. Normally, the microprocessor looks at the day schedule for the load corresponding to the real-time day of the week; however, the microprocessor looks at the holiday schedule for the load upon the real-time occurrence of a preset holiday data. For further details concerning the structure and operation of a controller of this type, reference should be made to the Carpenter et al. patent previously discussed.

Figure 2:
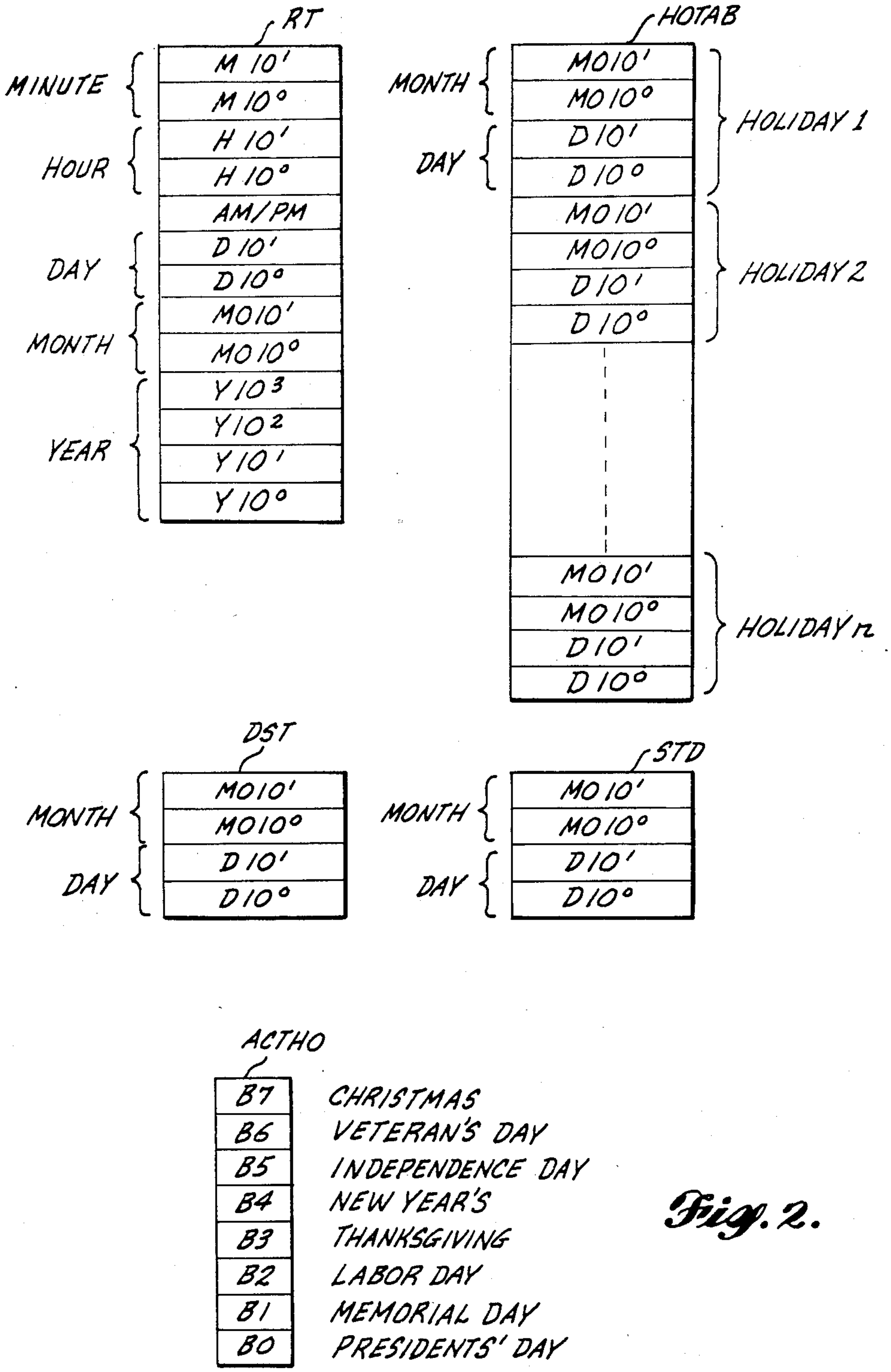
FIG. 2 is a schematic representation of certain registers and bytes in the data memory, including those storing the preset calendar events used by the controller.

Referring additionally now to FIG. 2, the real-time clock in data memory 26 consists of a RT register that is subdivided into a plurality of fields. The fields include: MINUTE fields containing the tens ($M10^1$) and units ($M10^0$) of the real-time numeric minute; HOUR fields containing the tens ($H10^1$) and units ($H10^0$) of the real-time numeric hour; and AM/PM field indicating whether the minute and hour are am or pm; DAY fields containing the tens ($D10^1$) and units ($D10^0$) of the real-time numeric day; MONTH fields containing the tens ($MO10^1$) and units ($MO10^0$) of the real-time numeric month; and, YEAR fields containing the thousands ($Y10^3$), the hundreds ($Y10^2$), the tens ($Y10^1$) and the units ($Y10^0$) of the real-time numeric year. The RT register accordingly comprises a yearly or 365-day clock, and the information contained therein is periodically updated by CPU 22 using a routine that references the time-base information in hardware clock 30.

Referring now back to FIG. 1, a plurality of controls 36 are provided that permit the user to enter or alter certain calendar events in data memory 26 to be used by microprocessor 20 in effecting load control. Controls 36 include a MONTH control and a DAY control that are used to enter or alter the numeric month and numeric day of a calendar event, a DST control that is used to indicate that the calendar event selected by the MONTH and DAY controls is the standard/daylight transition, a STD control that is used to indicate that the calendar event selected by the MONTH and DAY controls is the daylight/standard transition, a HOLIDAY control that is used to indicate that the calendar event selected by the MONTH and DAY controls is a holiday, a EOM control that is used to indicate that the standard/daylight transition or the daylight/standard transition is referenced to the end of the month, and a BOM control that is used to indicate that the standard/daylight transition or the daylight/standard transition is referenced to the beginning of the month.

In the situation where the selected calendar event is the standard/daylight transition, the month and day thereof are stored in a DST register in data memory 26. Referring again to FIG. 2, the DST register consists of: MONTH fields containing the tens ($MO10^1$) and units ($MO10^0$) of the numeric month; and, DAY fields containing the tens ($D10^1$) and units ($D10^0$) of the numeric day. In the situation where the selected calendar event is the daylight/standard transition, the month and day thereof are stored in a STD register in data memory 26 that consists of: MONTH fields containing the tens ($MO10^1$) and units ($MO10^0$) of the numeric month; and, DAY fields containing the tens ($D10^1$) and units ($D10^0$) of the numeric day. In the situation where the selected calendar event is a holiday, the month and day thereof are stored in a HOTAB register in data memory 26 that includes a plurality n of HOLIDAY fields in which are stored the numeric month and numeric day of up to n holidays. The HOLIDAY fields are arranged in chronological order, and each HOLIDAY field consists of: MONTH fields containing the tens ($MO10^1$) and units ($MO10^0$) of the numeric month; and, DAY fields containing the tens ($D10^1$) and units ($D10^0$) of the numeric day.

Entry of data into the DST and STD registers and into the various HOLIDAY fields in the HOTAB register is restricted so that the numeric month and numeric day are prospective only, that is, they must be a month and day that are equal to or in advance of the real-time numeric month and numeric day. Upon occurrence in real-time of the numeric month and numeric day contained in the DST register, CPU 22 advances the real-time information in the RT register by one hour. Upon occurrence in real-time of the numeric month and the numeric day in the STD register, CPU 22 retards the real-time information in the RT register by one hour. Upon occurrence of the numeric month and the numeric day in any HOLIDAY field in the HOTAB register, CPU 22 looks at the holiday schedule for any load that has been selected therefor rather than the day schedule therefor and concurrently erases the corresponding HOLIDAY field in the HOTAB register. Routines for implementing the foregoing procedures will be readily apparent to those of skill in the art by reference to analogous routines discussed in the Carpenter et al. patent.

The essential task of the invention is to provide a means by which the numeric month and numeric day of the standard/daylight transition, of the daylight/standard transition, and of certain selected "core" holidays may be periodically and automatically updated and reentered into the DST and STD registers and into corresponding HOLIDAY fields in the HOTAB register, in order that a user does not have to periodically redetermine and reenter the numeric month and numeric day of those calendar events.

In addressing this task, it must first be recognized that each calendar year can be visualized as consisting of a plurality of successive monthly matrices, the monthly matrices being ordered by numeric month or by alphabetic month. Each monthly matrix consists of a predetermined plurality of numeric days, the numeric days being arranged in columns by alphabetic days and in rows by numeric weeks. Certain calendar events always occur each year on the same numeric day in the same numeric week in the same numeric month. The position of each calendar event of this type in the corresponding monthly matrix accordingly will shift from year to year. Examples of calendar events of this type are the holidays Christmas (12/25), Veteran's Day (11/11), Independence Day (7/4), and New Year's (1/1). Certain other calendar events always occur each year on the same alphabetic day in the same numeric week in the same numeric month. Although the position of each calendar event of this type remains the same in the corresponding monthly matrix from year to year, the numeric day shifts from year to year. Examples of calendar events of this type are: the standard/daylight transition (which typically occurs on the last Sunday in April); the daylight/standard transition (which typically occurs on the last Sunday in October); Thanksgiving (which always occurs on the fourth Thursday in November); Labor Day (which always occurs on the first Monday in September); Memorial Day (which always occurs on the last Monday in May); and, Presidents' Day (which always occurs on the third Monday in February).

An investigation of the calendar reveals:

for a numeric day in a current year that is equal to or greater than March 1 and is equal to or less than December 31
: if the next year is not a leap year, the numeric day for each alphabetic day will be decreased by one the next year (1)

for a numeric day in a current year that is equal to or greater than January 1 and that is equal to or less than February 28
: if the the current year is not a leap year, the numeric day for each alphabetic day will be decreased by one the next year (2)

for a numeric day in a current year equal to or greater than March 1 and equal to or less than December 31
: if the next year is a leap year, the numeric day for each alphabetic day will be decreased by two the next year (3)

for a numeric day in a current year equal to or greater than January 1 and equal to or less than February 29
: if the current year is a leap year, the numeric day for each alphabetic day will be decreased by two the next year. (4)

Further recognizing that a specific calendar event such as Labor Day occured on a numeric "reference day" (e.g., 01) in a numeric "reference year" (e.g., 1980), the number of leap years and nonleap years that will elapse to any future year can be determined. From this inforation, the number of "decrement days" that the reference day must decremented by to give the numeric day for the specific calendar event in any future year can then be determined.

From statements (1) through (4), it can be appreciated that the reference year should be chosen as follows. If the numeric day of the calendar event is equal to or greater than March 1 and is equal to or less than December 31, the reference year should be a leap year. If the numeric day of the specific calendar event is equal to or greater than January 1 and is equal to or less than February 28 or February 29, the reference year should be the first year following a leap year.

After determining the decrement days for any specific calendar event, a further check must be made to determine as to whether the number of decrement days will move the numeric day of the calendar event into the preceding week. In making this determination, the number of decrement days may be divided by seven. The resultant quotient is discarded and the resultant remainder is retained. The remainder is then investigated to determine if the remainder would decrement the reference day into the preceding week. If this determination is affirmative, the numeric day for the calendar event is the reference day minus the decrement days plus seven; if this determination is negative, the numeric day for the calendar event is the reference day minus the decrement days.

An easier procedure to determine the numeric day of the specific calendar event is to relate the reference day to the following week by adding seven to the reference day before it is decremented. The resultant "temporary" numeric day is then compared with the maximum numeric day or "high limit" that is possible for the numeric week of the calendar event. If this determination is affirmative, the numeric day is the temporary numeric day minus seven. If this determination is negative, the numeric day is the temporary numeric day. For those calendar events whose alphabetic days are referenced to the beginning of a month, the high limits for the numeric weeks are:

| Week | High Limit Day |
|---|---|
| 1 | 7 |
| 2 | 14 |
| 3 | 21 |
| 4 | 28 |

For those calendar events whose alphabetic days are referenced to the end of a month, the high limits are:

| Week | High Limit Day |
|---|---|
| 1 | (Last day of month) - 28 |
| 2 | (Last day of month) - 21 |
| 3 | (Last day of month) - 14 |
| 4 | (Last day of month) - 7 |
| 5 | Last day of month |

Figure 3:
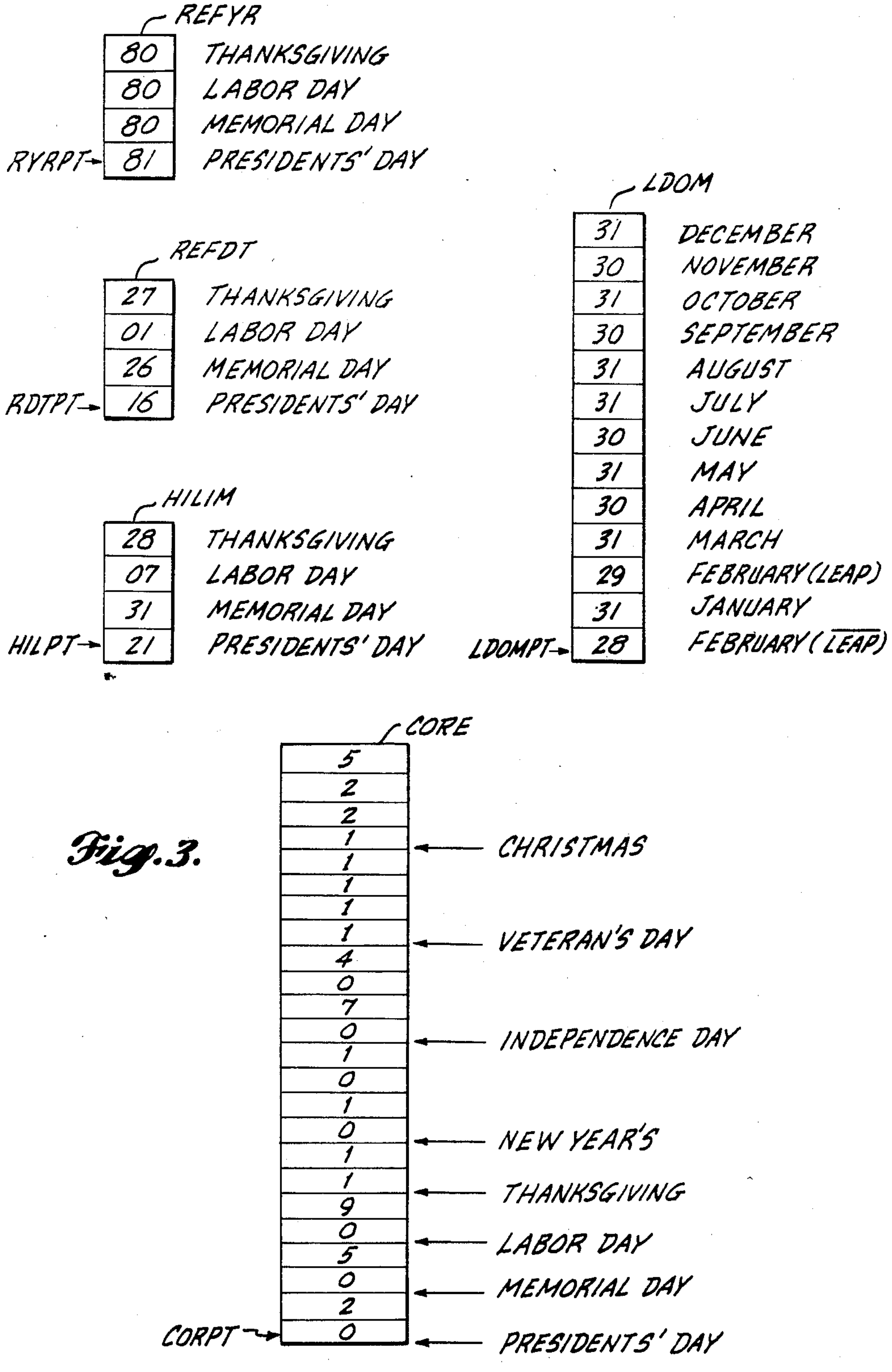
FIG. 3 is a schematic representation of certain tables in the program memory.

Exemplary routines that are executed by CPU 22 in periodically updating the calendar events in the aforesaid manner can be found in FIGS. 4 through 10, wherein CPU 22 references certain fixed data stored in program memory 24 as illustrated in FIG. 3 and certain variable data stored in data memory 26 as illustrated in FIG. 2.

Figure 4:
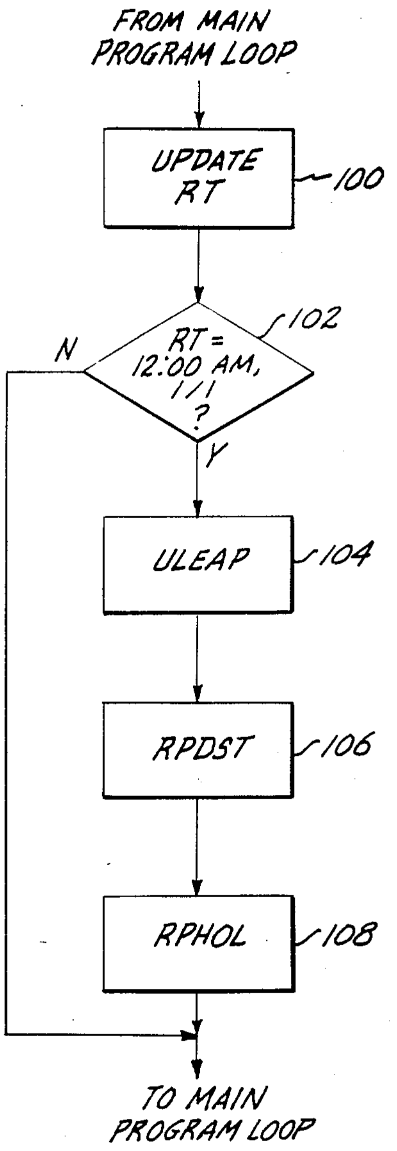
FIG. 4 is a flow chart of the main program steps undertaken by the microprocessor in periodically updating the preset calendar events.

Referring now to FIG. 4, the set of main program instructions illustrated therein are executed at an appropriate point in a main program loop through which CPU 22 repetitively passes. An example of such a main program loop can be found in FIGS. 7(*a*) and 7(*b*) of the Carpenter et al. patent, and an appropriate point for insertion of the main program instructions in FIG. 4 would be in the REAL-TIME CLOCK routine illustrated in FIG. 8 of that patent.

Initially, CPU 22 enters step 100 in which the real-time information in register RT is updated as necessary by looking at the time-base information from oscillator 30. If the real-time month and day in the RT register correspond to the numeric month and day stored in the DST register, the real-time information in the RT register is advanced by one hour. If the real-time month and day correspond to the numeric month and day in the STD register, the real-time information in the RT register is retarded by one hour. Preferably, advancement and retardation of the real-time information are done at a specified time in real-time such as 2:00 a.m. From step 100, CPU 22 proceeds in step 102 to determine if real-time is 12:00 a.m. on January 1. If the determination in step 102 is negative, CPU 22 returns to its main program loop. If the determination in step 102 is affirmative, CPU 22 proceeds through routines ULEAP, RPDST, and RPHOL in successive steps 104, 106, and 108, and then returns to its main program loop.

During the ULEAP routine, CPU 22 determines the relation of the real-time year to a leap year, which information is used in the succeeding routines. During the RPDST routine, CPU 22 determines the numeric day of the next daylight/standard transition and stores that numeric day and the numeric month therefor in the DST register, and determines the numeric day of the next daylight/standard transition and stores that numeric day and the numeric month therefor in the STD register. During the RPHOL routine, CPU 22 determines the numeric day for each of the core holidays having a fixed alphabetic day and stores that numeric day and the corresponding numeric month in a corresponding HOLIDAY field in the HOTAB register, along with the numeric days and months of the core holidays having fixed numeric days. The information in the DST and STD registers and the information in the HOLIDAY fields in the HOTAB register insofar as the core holidays are concerned is thus periodically updated at yearly intervals.

Figure 5:
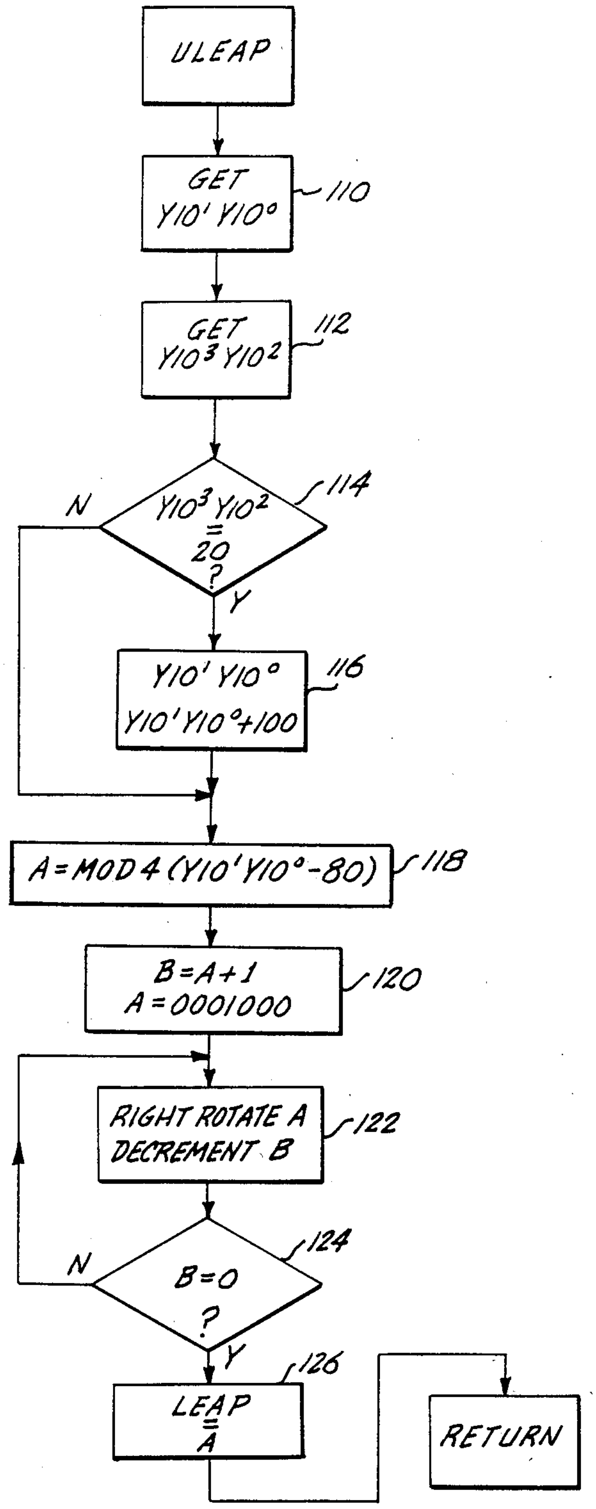
FIG. 5 is a flow chart of the program steps undertaken by the microprocessor in a ULEAP routine.
Figure 7:
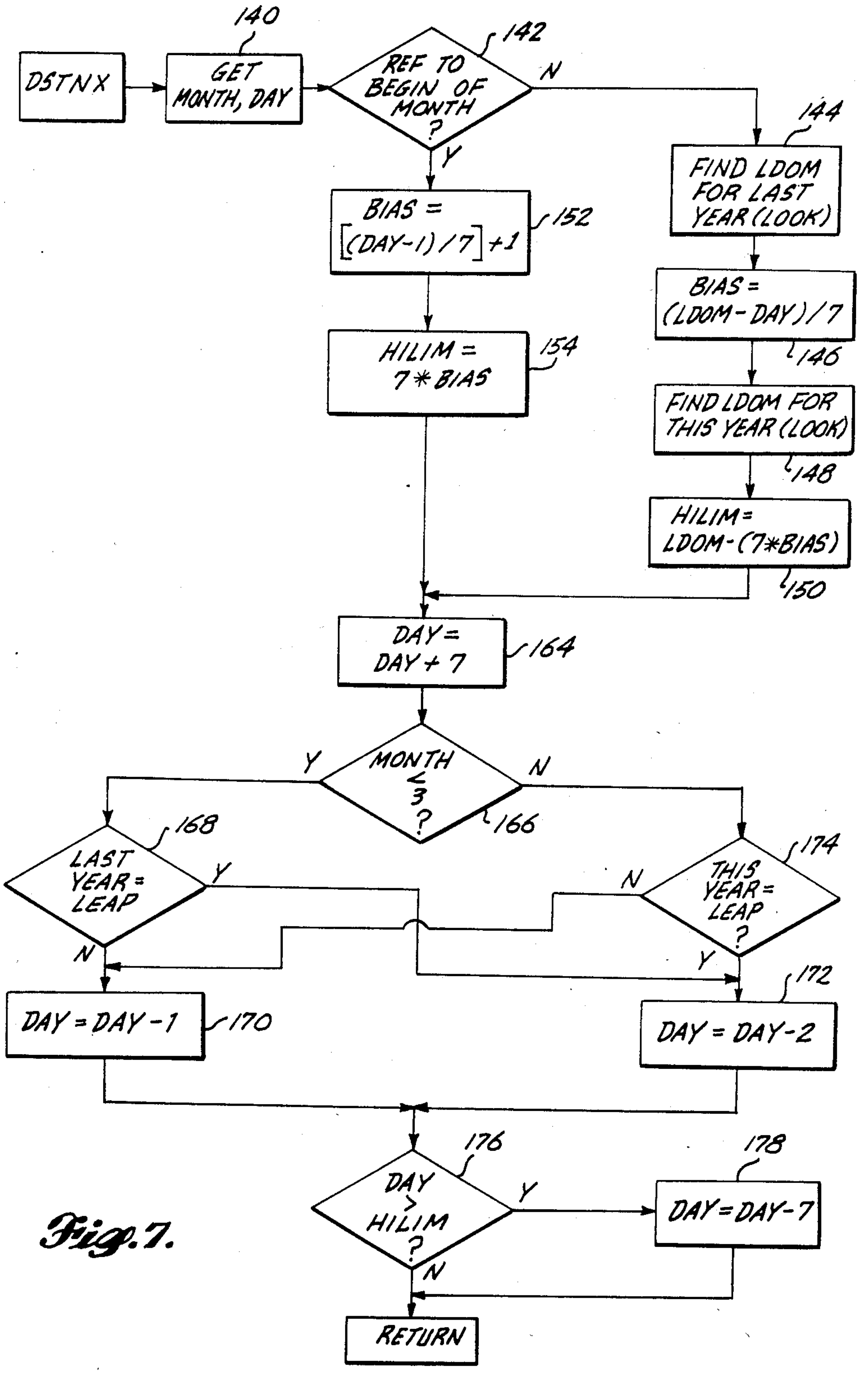
FIG. 7 is a flow chart of the program steps undertaken by the microprocessor in a DSTNX routine.

Referring now to the ULEAP routine in FIG. 5, CPU 22 first gets the tens ($Y10^1$) and the units ($Y10^0$) of the real-time year stored in the YEAR fields in the RT register, in step 110, and then gets the thousands ($Y10^3$) and the hundreds ($Y10^2$) of the real-time year stored in the YEAR fields in the RT register, in step 112. In step 114, CPU 22 determines if the current real-time year is between 2000 and 2100, by determining if the thousands and hundreds of the current real-time year are equal to "20". If the determination in step 114 is affirmative, CPU 22, in step 116, adds "100" to the tens and units of the real-time year so as to distinguish the years occurring at or after the year 2000 from those occurring before the year 2000.

For the purpose of determining the standard/daylight transitions and the daylight/standard transitions, the reference year is chosen to be the leap year 1980. In step 118, CPU 22 subtracts the tens and units of the reference year 1980 from the tens and units of the real-time year, divides the result by "4" and stores the remainder in its A register. CPU 22 then, in step 120, stores the contents of the A register, plus "1", in its B register, and stores a mask "00010000" in the A register. The information stored in the A and B registers is in binary, eight-bit form. Taking the real-time year 1983 as an example, the A register will contain "00010000" as previously described and the B register will contain "00000100". From step 120, CPU 22 in step 122 right rotates the contents of the A register by one bit position and decrements the number within the B register by one. CPU 22 then determines, in step 124, if the B register contains "0". If the determination in step 124 is negative, CPU 22 returns to step 122 and continues to loop through steps 122 and 124 until the determination in step 124 is affirmative, whereupon CPU 22 in step 126 stores the contents of the A register in a LEAP byte. CPU 22 then returns to its main program instructions illustrated in FIG. 4 (and thereafter to the RPDST routine).

Reference should be made to the following Table I for a specific example of how CPU 22 proceeds through steps 118 through 126 in determining the information to be stored in LEAP.

TABLE I

| Real-Time Year = 1983 | | Reference Year = 1980 | | |
|---|---|---|---|---|
| (118) | A = MOD 4 (83-80) | | = | 00000011 |
| (120) | B = A + 1 | | = | 00000100 |
| | A | | = | 00010000 |
| (122) | RRA | A | = | 00001000 |
| | DECB | B | = | 00000011 |
| (124) | | B | ≠ | 0 |
| (122) | RRA | A | = | 00000100 |
| | DECB | B | = | 00000010 |
| (124) | | B | ≠ | 0 |
| (122) | RRA | A | = | 00000010 |
| | DECB | B | = | 00000001 |
| (124) | | B | ≠ | 0 |
| (122) | RRA | A | = | 00000001 |
| | DECB | B | = | 00000000 |
| (124) | | B | = | 0 |
| (126) | | LEAP | = | 00000001 |

From the foregoing, it can be appreciated that LEAP will contain information that uniquely relates not only the real-time year but also the immediately adjacent years to a leap year, as summarized in Table II.

TABLE II

| Real-Time Year | LEAP |
|---|---|
| Leap year | 00001000 |
| First year following leap year | 00000100 |
| Second year following leap year | 00000010 |
| Third year following leap year | 00000001 |

The information in LEAP is used by CPU 22 in determining the numeric day of certain calendar events, that is, the standard/daylight transition and the daylight/standard transition, as described hereinafter.

Figure 6:
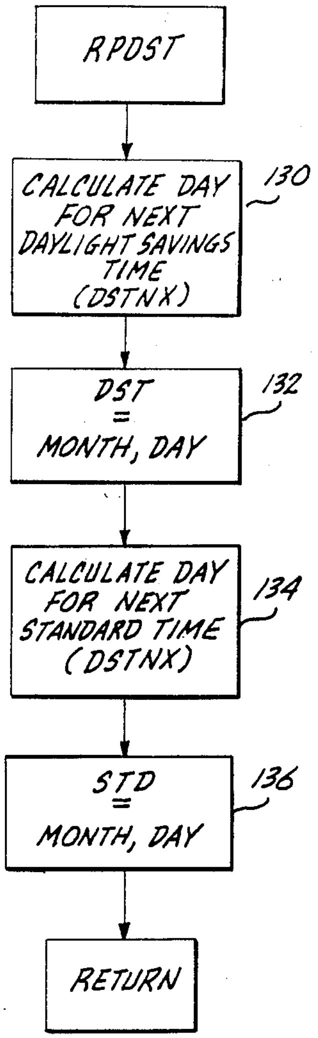
FIG. 6 is a flow chart of the program steps undertaken by the microprocessor in a RPDST routine.

Referring now to FIG. 6, CPU 22 next enters the RPDST routine and executes successive steps 130, 132, 134, and 136 in which the numeric day of the next standard/daylight transition is determined, that numeric day and the corresponding numeric month are stored in the DST register, the numeric day of the next daylight/standard transition is determined, and that numeric day and the corresponding numeric month are stored in the STD register. In determining the numeric days in steps 130 and 134, CPU 22 uses a common DSTNX routine illustrated in FIG. 7.

Initially, CPU 22 gets the numeric month and the numeric day stored in the DST or STD register corresponding to the calendar event being updated. CPU 22 then determines, in step 142, if the calendar event is referenced to the beginning of a month. In doing so, CPU 22 determines whether the EOM control or the BOM control (FIG. 1) has been actuated. Depending upon the results of this determination, CPU 22 either proceeds through a branch including steps 144, 146, 148, and 150, or through a branch including steps 152 and 154, to detemine the high limit HILIM representing the maximum numeric day for the specific numeric week of the calendar event. At present, both the standard/daylight transition and the daylight/standard transition are referenced to the end of the month, whereupon the determination in step 142 is negative. As a result, CPU 22 proceeds in step 144 to find the last day of the month (LDOM) for the year preceding the real-time year, by reference to a LOOK routine set forth in FIG. 8.

Referring back to FIG. 3, program memory 24 includes a LDOM table in which are stored the numeric last days of each month of a calendar year, including the numeric last day of February for both leap and nonleap years. The entries in the LDOM table are stored in the order of increasing numeric months, with the exception that the numeric last day for February for a nonleap year is the first entry in the table. The entries in the LDOM table are pointed to by a LDOMPT pointer.

Figure 8:
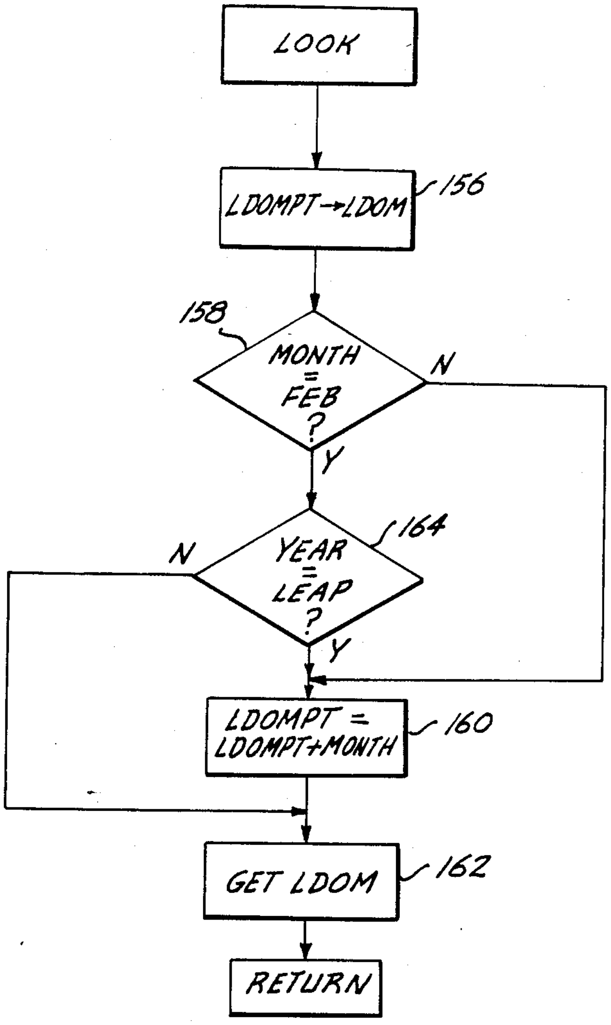
FIG. 8 is a flow chart of the program steps undertaken by the microprocessor in a LOOK routine.

Referring now to the LOOK routine in FIG. 8, CPU 22 initially in step 156 sets LDOMPT to point to the first entry in the LDOM table, e.g., that containing the last numeric day for a nonleap year February. In step 158, CPU 22 determines if the numeric month of the calendar event is February. If the determination in step 158 is negative, CPU 22 then proceeds in step 160 to move LDOMPT by the number of the numeric month for the calendar event. Due to the ordering of the LDOM table, LDOMPT thus points at the entry corresponding to the numeric month of the calendar event, whereupon CPU 22 in step 162 gets that entry and denominates it as the last day of the month for the year under investigation. It should be noted that the last day of the month is always the same for every month for every calendar year, excepting the month of February. Accordingly, CPU 22 normally will proceed through the LOOK routine in the manner described and will always do so in case of the present standard/daylight and daylight/standard transitions which occur in months other than February. Assuming, however, that the numeric month of the calendar event is February, the determination in step 158 is affirmative, whereupon CPU 22 determines in step 164 if the year under investigation is a leap year. While proceeding through step 164, CPU 22 makes its determination by comparing the LEAP byte determined in step 126 in the UNLEAP routine with a table such as Table II. If the determination in step 164 is affirmative, CPU 22 proceeds through steps 160 and 162 as previously described. If the determination in step 164 is negative, CPU 22 bypasses step 160 and proceeds directly to step 162, inasmuch as LDOMPT is pointing to the first entry in the LDOM table representing the last day of the month for a nonleap year February.

Returning now to FIG. 7, CPU 22 proceeds in step 146 to set a BIAS byte equal to the last day of the month that was found in step 144 minus the numeric day of the calendar event that was obtained in step 140, divided by "7". CPU 22 then returns, in step 148, to the LOOK routine and finds the last day of the numeric month of the calendar event for the real-time year. In step 150, CPU 12 sets a HILIM byte, representing the maximum numeric day for the numeric week of the calendar event, equal to the last day of the month found in step 148, minus the product of BIAS and "7".

Assuming now that the calendar event is referenced to the beginning of the month, the determination in step 142 is affirmative whereupon CPU 22, in step 152, subtracts "1" from the numeric day of the calendar event, divides the result by "7", adds "1", and stores the result in BIAS. In step 154, CPU 22 then sets HILIM equal to the product of BIAS, as determined in step 152, and "7".

Once having determined the high limit, CPU 22 then proceeds to determine the numeric day for the calendar event for the real-time year. In step 164, CPU 22 sets the numeric day obtained in step 140 to the numeric day plus "7". CPU 22 then determines, in step 166, if the numeric month obtained in step 140 is less than "3". If the determination in step 166 is affirmative, CPU 22 next determines in step 168 if the preceding year was a leap year, again by referring to the LEAP byte and a table such as Table II. If the determination in step 168 is negative, CPU 22 decrements the numeric day by "1" in step 170. If the determination in step 168 is affirmative, CPU 22 decrements the numeric day by "2" in step 172. Assuming that the numeric month is equal to or greater than "3", the determination in step 166 is negative whereupon CPU 22 proceeds in step 174 to determine if the real-time year is a leap year, again by referring to the LEAP byte and a table such as Table II. If the determination in step 174 is negative, CPU 22 proceeds to step 170 as previously described. If the determination in step 174 is affirmative, CPU 22 proceeds to step 172 as previously described. The various actions undertaken by CPU 22 in steps 166 through 174 can best be understood by reference to statements (1) through (4) previously described.

From either step 170 or step 172, CPU proceeds in step 176 to determine if the numeric day is greater than the HILIM byte determined in either of steps 150 or 154. If the determination in step 176 is affirmative, the numeric day has been moved into the succeeding week, whereupon CPU 22 proceeds in step 178 to subtract "7" from the numeric day. From step 178 or from a negative determination in step 176, CPU 22 then returns to the RPDST routine.

The operation of CPU 22 while passing through the DSTNX routine will be further explained with reference to the specific example in Table III.

TABLE III

Real-time year = 1983
Last standard/daylight transition = 04/25/82
LEAP = 00000001

| | | |
|---|---|---|
| (144) | LDOM = | 30 |
| (146) | BIAS = | (30 − 25)/7 |
| | = | 0 |
| (148) | LDOM = | 30 |
| (150) | HILIM = | 30 − (7 * 0) |
| | = | 30 |
| (164) | DAY = | 25 + 7 |
| | = | 32 |
| (166) | MONTH = | 4 > 3 |
| (174) | LEAP ≠ | 00001000 |
| (170) | DAY = | 32 − 1 |
| | = | 31 |
| (176) | | 31 > 30 |
| (178) | DAY = | 31 − 7 |
| | = | 24 |

When CPU 22 has passed through the DSTNX routine in step 130, the numeric month obtained in step 140 and the numeric day obtained in either steps 176 or 178 are stored in step 132 in the appropriate fields in the DST register and accordingly represent the month and day of the next standard/daylight transition. When CPU 22 has proceeded through the DSTNX routine in step 134, the numeric month obtained in step 140 and the numeric day obtained in either steps 176 or 178 are stored in step 136 in the appropriate fields in the STD register and accordingly represent the month and day of the next daylight/standard transition.

After completing the RPDST routine, CPU 22 then enters the RPHOL routine as previously described. Referring now to FIG. 3, program memory 24 includes a CORE table containing certain information concerning the plurality of core holidays whose numeric month and numeric day will be automatically reentered into the HOTAB table as CPU 22 passes through the RPHOL routine, provided that each core holiday has been selected as a holiday by the user. The core holidays are divided into two groups: a first group consisting of those core holidays whose numeric day changes from year to year; and, a second group consisting of those core holidays whose numeric day remains the same from year to year. The first group includes Presidents' Day, Memorial Day, Labor Day, and Thanksgiving, and the second group includes New Year's, Independence Day, Veteran's Day, and Christmas. For those core holidays in the first group, the COREe table stores the numeric month of the holiday. For those core holidays in the second group, the CORE table stores the numeric month and numeric day of the holiday. The table entries are arranged in the CORE table in chronological order within each group and are pointed to by a CORPT pointer. Also stored in program memory 24 are a REFYR table, a REFDT table, and a HILIM table. The REFYR table contains the tens and units of the reference year for each core holiday in the first group, and the entries in the REFYR table are pointed to by a RYRPT pointer. The REFDT table contains the reference day for each core holiday in the first group, and the entries in the REFDT table are pointed to by a RDTPT pointer. The HILIM table contains the high limit day for each core holiday in the first group, and the entries in the HILIM table are pointed to by a HILPT pointer. The various entries in the REFYR, REFDT, and HILIM tables are arranged in chronological order. The selection or deselection of any core holiday as a holiday for the controller is signified by the setting or clearing of a corresponding bit in an ACTHO byte in data memory 26, as illustrated in FIG. 2.

Figure 9:
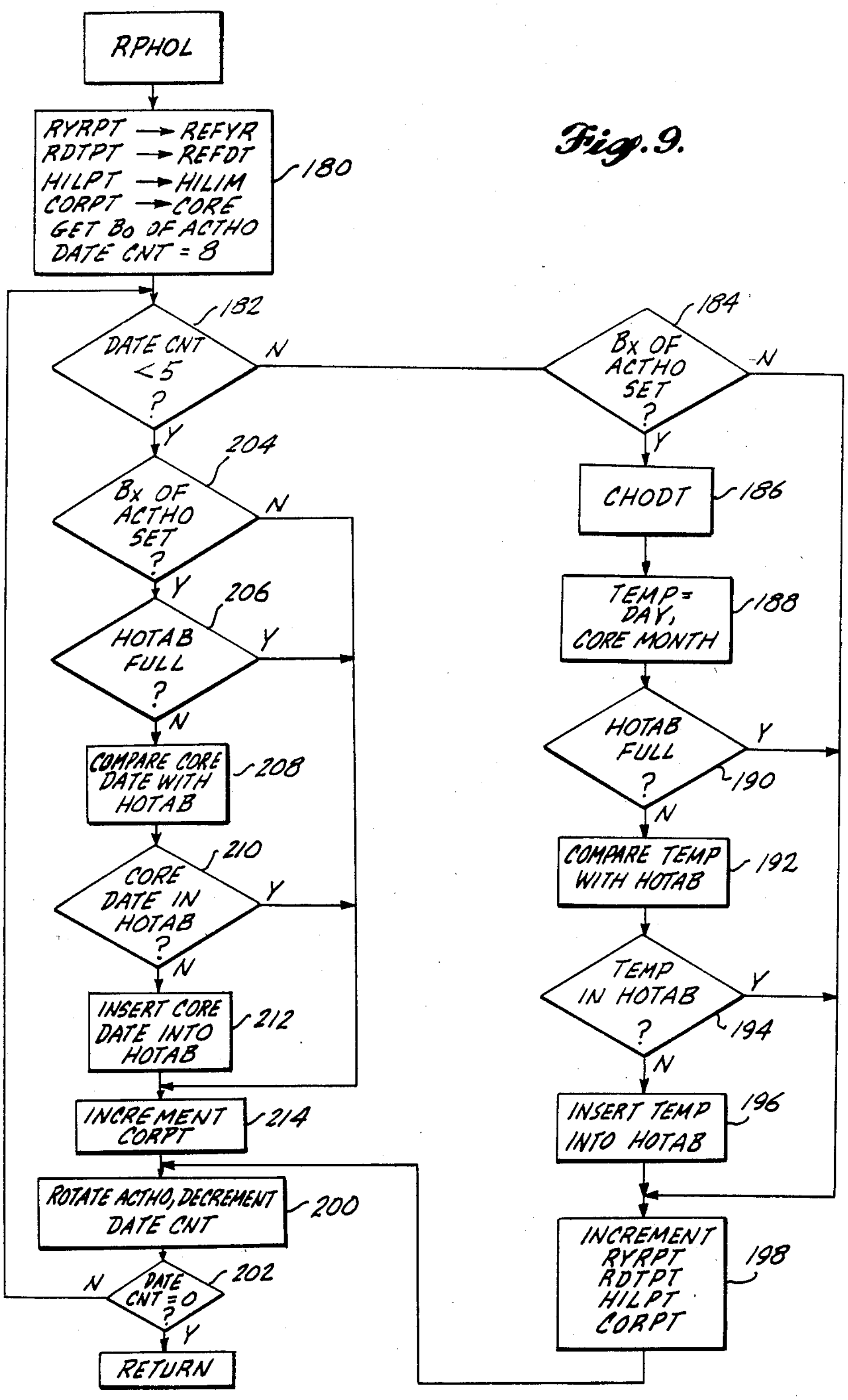
FIG. 9 is a flow chart of the program steps undertaken by the microprocessor in a RPHOL routine; and, FIG. 10 is a flow chart of the program steps undertaken by the microprocessor in a CHODT routine.
Figure 10:
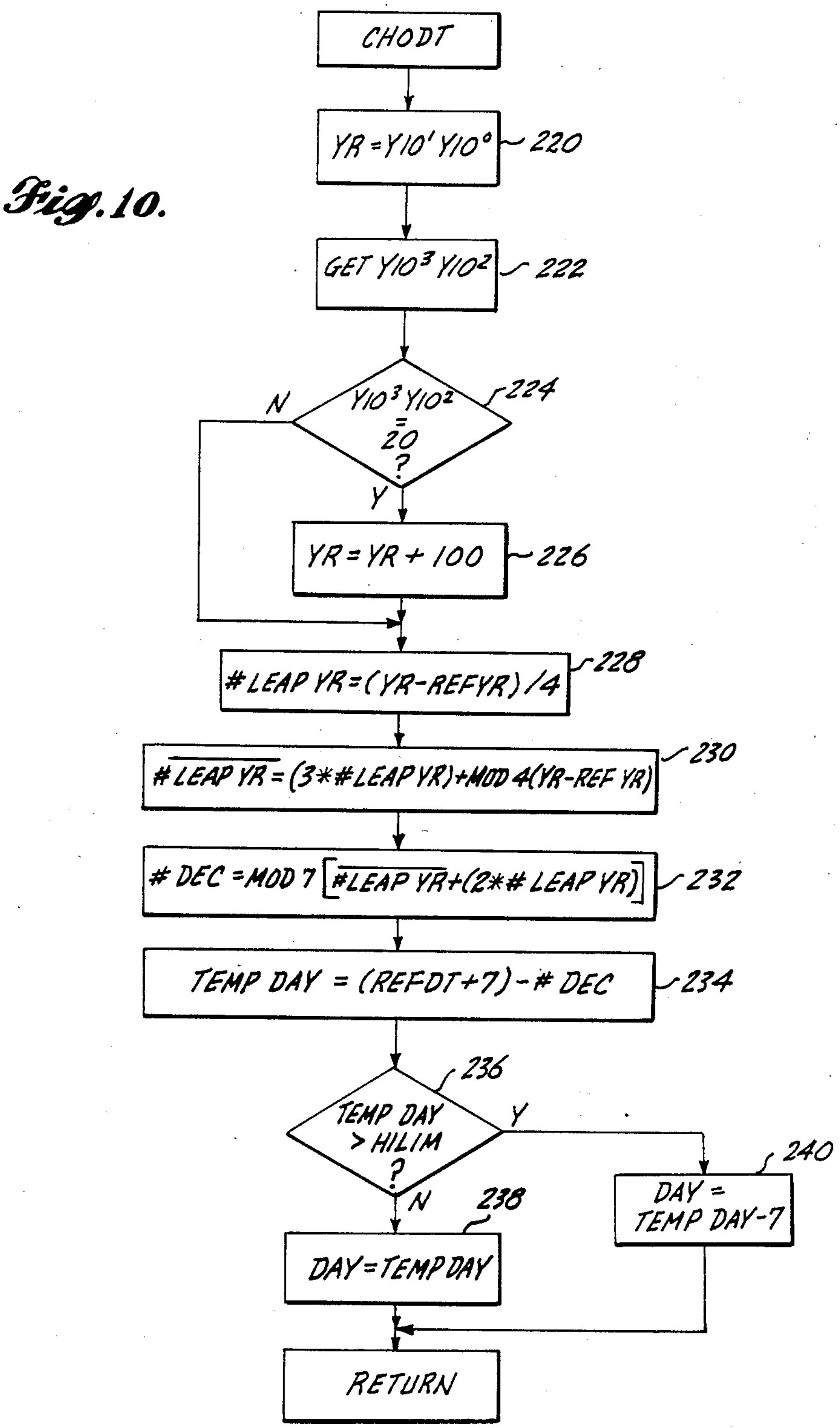

Referring now to the RPHOL routine in FIG. 9, CPU 22 in step 180 initializes the RYRPT, RDTPT, HILPT, and CORPT pointers to the initial entry in each of the REFYR, REFDT, HILIM, and CORE tables, whereupon those pointers point to the entries asociated with the first-in-time core holiday in the first group (for which a numeric day determination must be made). CPU 22 also obtains the first bit (B0) of the ACTHO byte (which likewise indicates whether or not the first-in-time core holiday in the first group has been selected as a holiday), and sets a DATE CNT counter to "8". In step 182, CPU 22 determines if DATE CNT is less than "5". If the determination in step 182 is negative, the core holiday to be investigated is one of those in the first group. If the determination in step 182 is affirmative, the core holiday to be investigated is one of the core holidays in the second group (for which no numeric day determination need be made). Assuming that the determination in step 182 is negative, CPU 22 proceeds in step 184 to see if the bit of ACTHO that has been obtained (e.g., in step 180) is set. If the pointed-to core holiday has been selected as a holiday, the determination in step 184 is affirmative whereupon CPU 22 proceeds in step 186 to a CHODT routine illustrated in FIG. 10.

During the CHODT routine, the numeric day of the pointed-to core holiday is determined for the real-time year. In step 220, CPU 22 sets a YR byte equal to the tens and units of the real-time year contained in the YEAR fields in the RT register. In step 222, CPU 22 gets the thousands and hundreds of the real-time year from the appropriate YEAR fields in the RT register. Thereafter, CPU 22 determines, in step 224, if the thousands and hundreds of the real-time year equal "20", that is, if the real-time year is between the year 2000 and the year 2100. If the determination in step 224 is affirmative, CPU 22 proceeds in step 226 to add 100 to the YR byte so as to distinguish the years occurring before the year 2000 from those occurring at or after the year 2000. From either step 226 or from a negative determination in step 224, CPU 22 then determines, in step 228, the number of leap years that have elapsed from the reference year of the core holiday to the real-time year. In doing so, CPU 22 subtracts the pointed-to reference year in the REFYR table from the real-time year in YR, divides the result by "4", and stores the quotient in a #LEAPYEAR byte. CPU 22 next, in step 230, determines the number of nonleap years that have elapsed from the reference year to the real-time year. In doing so, CPU 22 multiplies "3" by the year in #LEAPYEAR, adds thereto the remainder after dividing the difference between the years in YR and REFYR by "4", and stores the result in a $\overline{\text{\#LEAPYEAR}}$ byte. Using #LEAPYEAR and $\overline{\text{\#LEAPYEAR}}$, CPU 22 then determines in step 232 the number of decrement days by multiplying the year in #LEAPYEAR by "2", adding the result to the year in $\overline{\text{\#LEAPYEAR}}$, dividing the result by "7", and storing the remainder in a #DEC byte. A temporary numeric day for the core holiday is then determined in step 234 by adding "7" to the pointed-to reference day in the REFDT table, subtracting the decrement days in #DEC therefrom, and storing the result in a TEMP DAY byte. In step 236, CPU 22 determines if the temporary numeric day in TEMP DAY is greater than the pointed-to high limit in the HILIM table. If the determination in step 236 is negative, CPU 22 in step 238 selects the temporary numeric day as the numeric day for the core holiday for the real-time year. If the determination in 236 is affirmative, CPU 22 in step 240 selects the temporary numeric day minut "7" as the numeric day. From either step 238 or step 240, CPU 22 returns to the RPHOL routine.

Those skilled in the art will appreciate that the steps in the CHODT routine are equivalent to those in the ULEAP and RPDST routines, but that the determination of the numeric day is made in a slightly different manner in order to accommodate the differing reference years, reference days, and high limits for the various core holidays in the first group. The example found in Table IV will further illustrate the CHODT routine.

TABLE IV

| | |
|---|---|
| Real-time year = | 1983 |
| Core holiday = | President's Day |
| Reference year = | 1981 |
| Reference day = | 16 |

TABLE IV-continued

| | | |
|---|---|---|
| | High limit = | 21 |
| (228) | #LEAPYR = | (83 − 81)/4 |
| | = | 0 |
| (230) | $\overline{\text{\#LEAPYR}}$ = | (3 * 0) + MOD 4 (83 − 81) |
| | = | 0 + 2 |
| | = | 2 |
| (232) | #DEC = | MOD 7 [2 + (2 * 0)] |
| | = | 2 |
| (234) | TEMP DAY = | (16 + 7) − 2 |
| | = | 21 |
| (236) | TEMP DAY = | HILIM |
| (238) | DAY = | TEMP DAY |
| | = | 21 |

Returning now to FIG. 9, CPU 22 in step 188 stores the numeric day determined in the CHODT routine and the pointed-to numeric month for the core holiday in the CORE table in a TEMP byte. CPU 22 then determines in step 190 if all HOLIDAY fields in the HOTAB table contains entries. If the determination in step 190 is negative, CPU 22 then in step 192 compares the numeric month and numeric day in TEMP with those in the various HOLIDAY fields in the HOTAB table, and determines in step 194 if a match has been found. If the determination in step 194 is negative, CPU 22 then in step 196 inserts the numeric month and numeric in TEMP in the appropriate chronological HOLIDAY field in the HOTAB table, rearranging, if necessary, the entries therein to assure that all entries are in chronological order.

If the pointed-to core holiday has not been selected as a holiday by the user, or if all of the HOLIDAY fields in the HOTAB register contain entries, or if the numeric month and numeric day in TEMP are already contained in the HOTAB register, the determination in step 184 is negative, or the determination in step 190 is affirmative, or the determination in step 194 is affirmative. In any of these situations, or from step 196, CPU 22 proceeds in step 198 to increment the RYRPT, RDTPT, HILPT, and CORPT pointers to the next entries in the corresponding REFYR, REFDT, HILIM, and CORE tables. In succeeding step 200, CPU 22 gets the next succeeding bit in the ACTHO byte and decrements the number in the DATE CNT counter. In step 202, CPU 22 determines if the number in DATE CNT is "0". Assuming that all core holidays have not yet been investigated, the determination in step 202 is negative, whereupon CPU 22 returns to step 182.

CPU 22 continues to loop through the RPHOL routine as described until all of the core holidays in the first group have been investigated. Following the investigation of the last core holiday in the first group, the determination in step 182 is affirmative whereupon CPU 22 executes steps 204, 206, 208, 210, 212, and 214 for each core holiday in the second group. The actions taken by CPU 22 in these steps are similar to those previously described for the core holidays in the first group, with the exception that the numeric day of the core holiday is not determined, but rather obtained from the appropriate entry in the CORE table. As a result, the numeric month and the numeric day of each core holiday in the second group is stored in the appropriate chronological HOLIDAY field in the HOTAB register, provided that the core holiday has been selected as a holiday, the HOTAB register is not full, and that the numeric month and numeric day of the core holiday are not already contained in the HOTAB register.

While the invention has been described by reference to a preferred embodiment and several examples, it is to be clearly understood by those skilled in the art that the invention is not limited thereto and that the scope of the invention is to be interpreted only in conjunction with the appended claims.

The embodiments of the invention in which an exclusive property or privilege is claimed are defined as follows:

1. In an electronic controller that includes at least one load control circuit for controlling the energization state of a corresponding electrical load, and, a data processor operating under control of a stored program for: accumulating real-time information representing the numeric day, month and year of real-time; storing a predetermined schedule for control of the load; comparing its predetermined schedule for load control with its real-time information; causing the load control circuit to control the energization state of the load in accordance with that comparison; storing at least one calendar event by its numeric day and its numeric month, the calendar event being of the type that always occurs on the same alphabetic day always having the same relationship to the beginning or end of the same month in any year; comparing the stored numeric day and numeric month of the calendar event with its real-time information; and, undertaking a predetermined control action relating either to its real-time information or to its schedule for load control upon the occurrence in real-time of the stored numeric day and numeric month of the calendar event, the improvement wherein the data processor is operative to:

select, as a reference day, the numeric day of the calendar event in a given year;

select, as a reference year, the numeric year of said given year; and, update the stored numeric day of the calendar event by periodically:

(a) determining the real-time numeric year from its real-time information;

(b) determining a temporary numeric day for the calendar event by decrementing said reference day in relation to the number of leap years and nonleap years that have elapsed between said reference year and said real-time year;

(c) determining a numerical limit for the numeric day of the calendar event in view of the relationship of the corresponding alphabetic day to the beginning or end of the month in which the alphabetic day occurs;

(d) comparing said temporary numeric day with said numerical limit and adjusting said temporary numeric day so that said temporary numeric day falls within said numerical limit; and, (e) storing said temporary numeric day as the numeric day of the calendar event for said real-time year.

2. The improvement of claim 1, wherein the data processor is operative to update the stored numeric day of the calendar event at yearly intervals.

3. The improvement of claim 2, wherein the data processor is operative to update the stored numeric day of the calendar event at the beginning of each real-time year.

4. The improvement of claim 1, wherein said numerical limit is the maximum number that the numeric day of a calendar event can have in any year, given its relationship to the beginning or to the end of the month, wherein the number "seven" is first added to said reference day before said reference day is decremented, and wherein said temporary numeric day is adjusted by subtracting the number "seven" therefrom only if said temporary numeric day is greater than said numerical limit.

5. The improvement of claim 4, wherein the numeric day of the calendar event always occurs in the same week referenced to the beginning of the month, and wherein the data processor is operative to determine said numerical limit by obtaining a stored value representing the maximum numeric day for that week of the month in any year.

6. The improvement of claim 4, wherein the numeric day of the calendar event always occurs in the same week referenced to the end of the month, and wherein the data processor is operative to determine said numerical limit by obtaining a stored value representing the last day of the month for said real-time year and by subtracting therefrom the product of the number "seven" and the number by which that week is referenced to the end of the month.

7. The improvement of claim 1, wherein said data processor is operative to:

select the stored numeric day of the calendar event for the year preceding said real-time year as said reference day;

select the numeric year of said preceding year as said reference year;

determine said temporary numeric day by;

(a) determining whether each of said real-time year and said reference year is a leap year or a nonleap year;

(b) subtracting the number "two" from said reference day if the numeric month of the calendar event is less than the number "three" and if said reference year is a leap year;

(c) subtracting the number "two" from said reference day if the numeric month of a calendar event is equal to or greater than the number "three" and if said real-time year is a leap year;

(d) subtracting the number "one" from said reference day if the numeric month of the calendar event is less than the number "three" and if said reference year is a nonleap year; and, (e) subtracting the number "one" from said reference day if the numeric month of the calendar event is equal to or greater than the number "three" and if said real-time is a nonleap year.

8. The improvement of claim 1, wherein said data processor is operative to determine said temporary numeric day by:

determining the number of leap years that have elapsed between said reference year and said real-time year;

determining the number of nonleap years that have elapsed between said reference year and said real-time year;

determining a number of decrement days by obtaining the remainder, after dividing by the number "seven", of the sum of said number of nonleap years plus the product of the number "two" and said number of leap years; and, subtracting said number of decrement days from said reference day.

9. The improvement of claim 8, wherein said data processor is operative to determine said number of leap years by subtracting said reference year from said real-time year, by dividing the result by the number "four", and by saving the resultant quotient.

10. The improvement of claim 8, wherein said data processor is operative to determine said number of non-leap years by multiplying said number of leap years by the number "three", and by adding to the result the remainder, after dividing by the number "four", of said real-time year minus said reference year.

11. The improvement of claim 8, wherein said data processor is operative to select as said reference year the numeric year of a leap year if the numeric month of the calendar event is equal to or greater than the number "three".

12. The improvement of claim 8, wherein said data processor is operative to select as said reference year the numeric year of the first year following a leap year if the numeric month of the calendar event is less than the number "three".

13. The improvement of claim 1, wherein said calendar event is a time transition from standard to daylight time or from daylight to standard time.

14. The improvement of claim 1, wherein said calendar event is a holiday.

15. The improvement of claim 1, for use with a data processor that stores and utilizes the numeric day and numeric month of each of a plurality of calendar events of the type described, wherein the data processor undertakes each of the operations recited in claim 1 for each of the calendar events.

16. An apparatus for determining and storing the current numeric day of a preset calendar event that always occurs on the same alphabetic day always having the same relationship to the beginning or end of the same month in any year, comprising:

means for storing a reference day value representing the numeric day of the calendar event in a given year;

means for storing a reference year value representing the numeric year of said given year;

means determining a real-time year value representing the numeric year of the real-time year;

means determining a current numeric day value for the calendar event from said reference day value, said reference year value, and said real-time year value; and, means storing said current numeric day value.

17. The apparatus of claim 16, wherein said means determining said current numeric day value includes:

means determining a temporary numeric day value for the calendar event by decrementing said reference day value in relation to the number of leap years and nonleap years that have elapsed between the year represented by said reference year value and the year represented by said real-time year value;

means determining a numerical limit for the current numeric day value in view of the relationship of the corresponding alphabetic day to the beginning or end of the month in which the alphabetic day occurs;

means comparing said temporary numeric day value with said numerical limit and adjusting said temporary numeric day value so that said temporary numeric day value falls within said numerical limit; and, means selecting said temporary numeric day value as said current numeric day value.

* * * * *

UNITED STATES PATENT AND TRADEMARK OFFICE

CERTIFICATE OF CORRECTION

PATENT NO. : 4,573,127

DATED : February 25, 1986

INVENTOR(S) : William W. Korff

It is certified that error appears in the above-identified patent and that said Letters Patent is hereby corrected as shown below:

Column 2, line 17, "eacy" should be --each--.

Column 2, line 18, after "to", insert --be--.

Column 6, line 47, delete "the" (second occurrence).

Column 6, line 63, "occured" should be --occurred--.

Column 6, line 67, "inforation" should be --information--.

Column 6, line 68, insert --be-- before "decremented".

Column 10, line 5, "detemine" should be --determine--.

Column 10, line 51, "UNLEAP" should be --ULEAP--.

Column 10, line 67, "12" should be --22--.

Column 12, line 27, "CORe" should be --CORE-- .

Column 12, line 55, "asociated" should be --associated--.

Column 13, line 53, "minut" should be --minus--.

Column 13, line 67 (Table IV, line 2), "President's" should be --Presidents'--.

Column 14, line 5 (Table IV, line 8) "#LEAPYR" should be --#LEAPYR--.

Column 14, line 26, insert --day-- after "numeric" (second occurrence).

UNITED STATES PATENT AND TRADEMARK OFFICE

CERTIFICATE OF CORRECTION

PATENT NO. : 4,573,127

DATED : February 25, 1986

INVENTOR(S) : William W. Korff

It is certified that error appears in the above-identified patent and that said Letters Patent is hereby corrected as shown below:

Column 16, line 30, (Claim 7, line 8) ";" should be -- : --.

Signed and Sealed this

*Twenty-fourth* Day of *June 1986*

[SEAL]

*Attest:*

DONALD J. QUIGG

*Attesting Officer* *Commissioner of Patents and Trademarks*